United States Patent
Beat

(10) Patent No.: US 10,482,950 B2
(45) Date of Patent: Nov. 19, 2019

(54) STATIC RANDOM ACCESS MEMORY DEVICES INCLUDING A PLURALITY OF STORAGE CELLS AND A READ/WRITE CIRCUIT

(71) Applicant: Silicon Basis Ltd, Bristol (GB)

(72) Inventor: Robert Charles Beat, Bristol (GB)

(73) Assignee: PLATIPUS LIMITED, Bristol (GB)

( * ) Notice: Subject to any disclaimer, the term of this patent is extended or adjusted under 35 U.S.C. 154(b) by 592 days.

(21) Appl. No.: 14/390,455

(22) PCT Filed: Apr. 3, 2013

(86) PCT No.: PCT/GB2013/000150
§ 371 (c)(1),
(2) Date: Oct. 3, 2014

(87) PCT Pub. No.: WO2013/150260
PCT Pub. Date: Oct. 10, 2013

(65) Prior Publication Data
US 2015/0294713 A1    Oct. 15, 2015

(30) Foreign Application Priority Data
Apr. 4, 2012    (GB) .................................. 1206037.2

(51) Int. Cl.
*G11C 11/00*    (2006.01)
*G11C 11/419*    (2006.01)
(Continued)

(52) U.S. Cl.
CPC ............ *G11C 11/419* (2013.01); *G11C 5/025* (2013.01); *G11C 11/412* (2013.01)

(58) Field of Classification Search
CPC ........................... G11C 11/419; G11C 11/412
See application file for complete search history.

(56) References Cited

U.S. PATENT DOCUMENTS

| 4,189,785 A | 2/1980 | Rapp |
| 4,796,227 A | 1/1989 | Lyon et al. |

(Continued)

FOREIGN PATENT DOCUMENTS

| EP | 0136811 A2 | 4/1985 |
| JP | 2008269751 A | 11/2008 |

OTHER PUBLICATIONS

European Search Report dated Jun. 26, 2013 in Application No. GB1206037.2.
(Continued)

*Primary Examiner* — Toan K Le
(74) *Attorney, Agent, or Firm* — Maschoff Brennan

(57) ABSTRACT

The present application relates to an improved static random access memory (SRAM) device having a plurality of storage cells and a separate read/write circuit. Each of the plurality of storage cells is connected to a read/write data node of the read/write circuit by a dedicated connection, and an access switch which permits read/write access to the storage cell. The dedicated connection exhibits a greater capacitance than the read/write data node of the read/write circuit, such that the primary read mechanism of the SRAM is charge equalization. The SRAM write data connection to the read/write node of the read/write circuit, to permit data to be written to the plurality of storage cells. Write assist techniques are disclosed which assist writing of a '1' to the plurality of storage cells.

18 Claims, 7 Drawing Sheets

(51) Int. Cl.
*G11C 5/02* (2006.01)
*G11C 11/412* (2006.01)

(56) References Cited

U.S. PATENT DOCUMENTS

| | | | |
|---|---|---|---|
| 5,831,896 A | 11/1998 | Lattimore et al. | |
| 6,552,925 B1 | 4/2003 | Brooks | |
| 7,110,281 B1 | 9/2006 | Voogel et al. | |
| 8,848,479 B2* | 9/2014 | Ngu | G11C 8/16 365/189.07 |
| 2004/0222817 A1 | 11/2004 | Madurawe | |
| 2006/0056229 A1* | 3/2006 | Maeda | G11C 5/063 365/154 |
| 2006/0104102 A1 | 5/2006 | Choi et al. | |
| 2009/0147561 A1 | 6/2009 | Takahiko et al. | |
| 2009/0168483 A1* | 7/2009 | Hsu | G11C 11/419 365/72 |
| 2009/0244955 A1* | 10/2009 | Sasaki | G11C 11/412 365/154 |
| 2010/0110773 A1* | 5/2010 | Sachdev | G11C 11/412 365/154 |
| 2010/0157705 A1* | 6/2010 | Geuskens | G11C 7/12 365/203 |
| 2011/0305099 A1* | 12/2011 | Sharma | G11C 7/12 365/203 |
| 2012/0008377 A1 | 1/2012 | Ching-te et al. | |
| 2012/0075939 A1* | 3/2012 | Sampigethaya | G11C 7/1051 365/189.15 |
| 2012/0147680 A1* | 6/2012 | Koike | G11C 5/147 365/189.011 |
| 2012/0212997 A1* | 8/2012 | Chang | G11C 8/16 365/154 |
| 2012/0224414 A1* | 9/2012 | Deng | G11C 11/419 365/156 |
| 2012/0281458 A1* | 11/2012 | Teman | G11C 11/412 365/156 |
| 2012/0327705 A1* | 12/2012 | Chen | G11C 11/412 365/156 |
| 2013/0021839 A1* | 1/2013 | Ishikura | G11C 11/412 365/154 |
| 2013/0163311 A1* | 6/2013 | Hanafusa | G11C 11/419 365/154 |
| 2013/0201753 A1* | 8/2013 | Adams | G11C 11/419 365/154 |
| 2013/0258757 A1* | 10/2013 | Iyer | G11C 11/412 365/154 |

OTHER PUBLICATIONS

B. Calhoun and A. Chandrakasan "A 256kb 65nm Sub-threshold SRAM Design for Ultra-Low-Voltage Operation" IPPP Journal of Solid-state Circuits, Mar. 2007, vol. 42, No. 3 pp. 680-688.

H. Pilo, C Barwin et al "An SRAM Design in 65-nm Technology Node Featuring Read and Write-Assist Circuits to Expand Operating Voltage" IEEE Journal of Solid-state Circuits, Apr. 2007, vol. 42, No. 4 pp. 813-819.

Shigeki Ohbayashi et al "A 65-nm SoC Embedded 6T-SRAM Designed for Manufacturability with Read and Write Operation Stablilizing Circuits" IEEE Journal of Solid-state Circuits, Apr. 2007, vol. 42, No. 4 pp. 820-829.

* cited by examiner

PRIOR ART
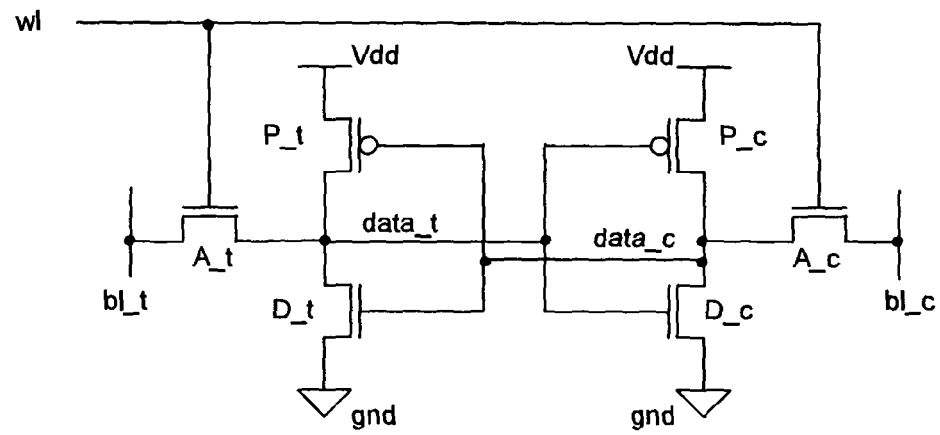
Figure 1. Six transistor (6T) SRAM cell
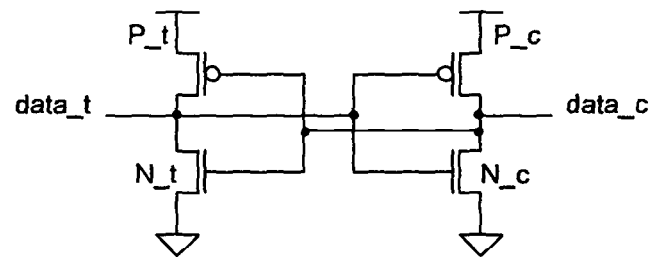
Figure 2. Proposed data cell

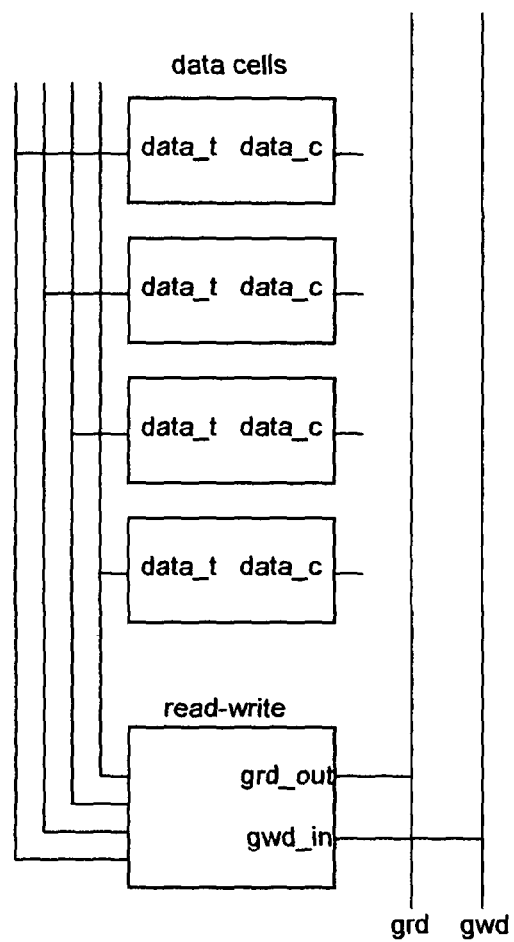
Figure 3. Cell column and read-write circuit

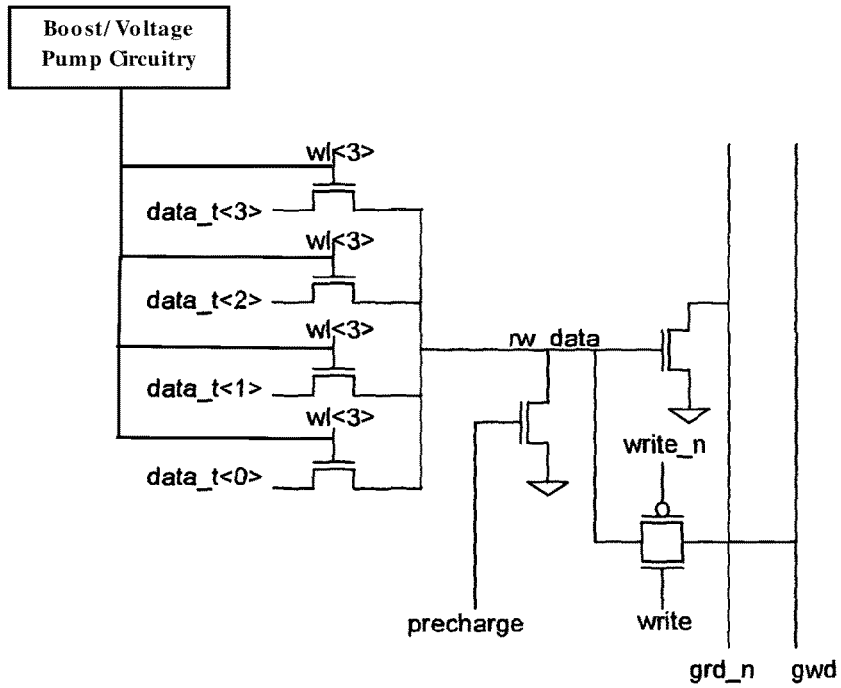
Figure 4. The read-write circuit with nmos output transistor
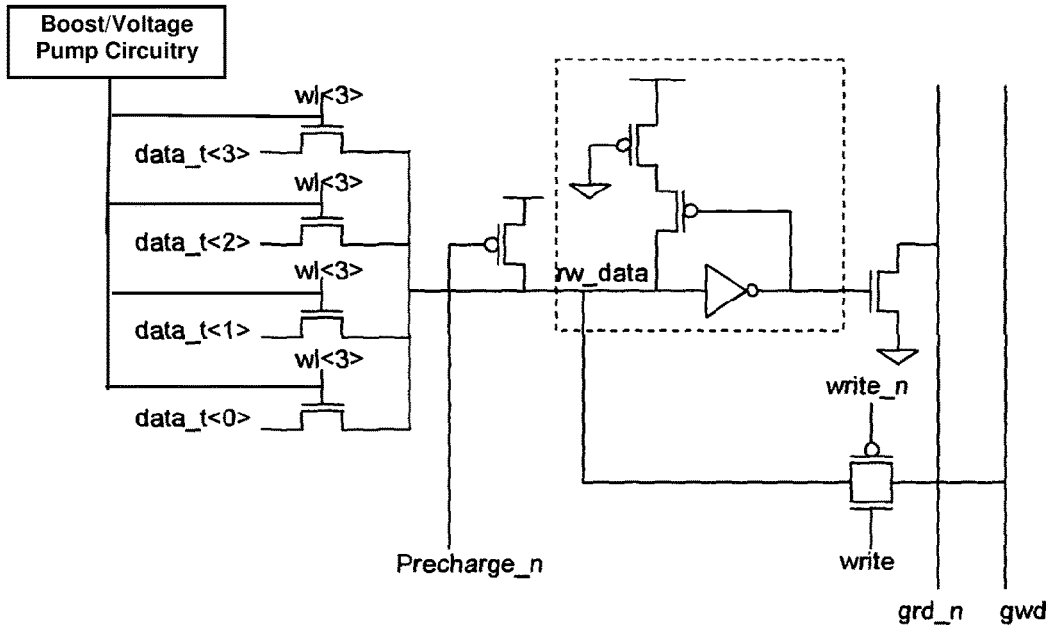
Figure 5. A read-write circuit with output voltage recovery

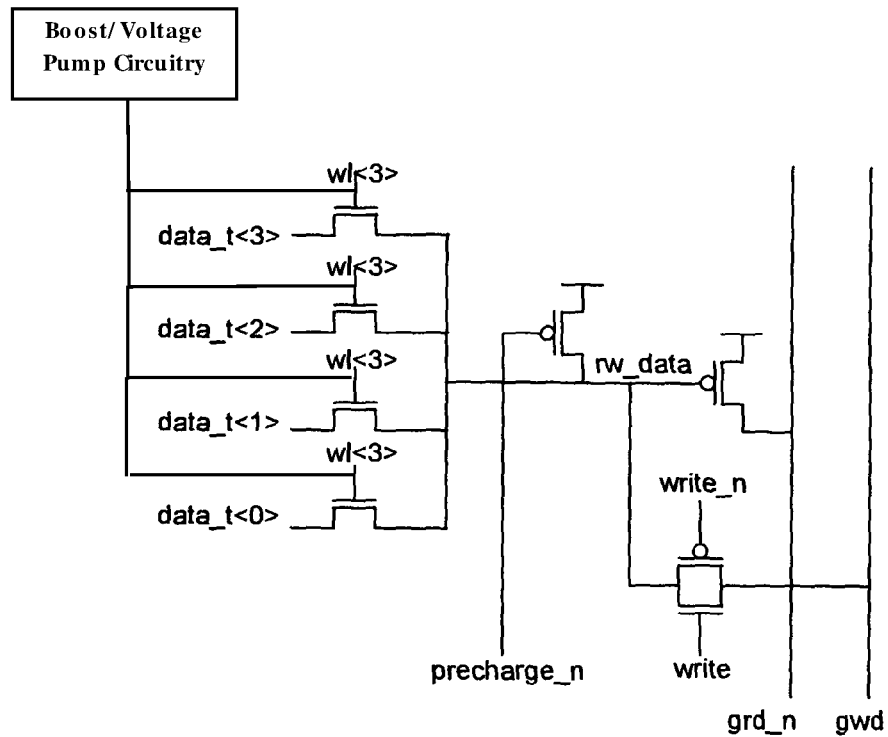
Figure 6. A read-write circuit with full swing by precharge
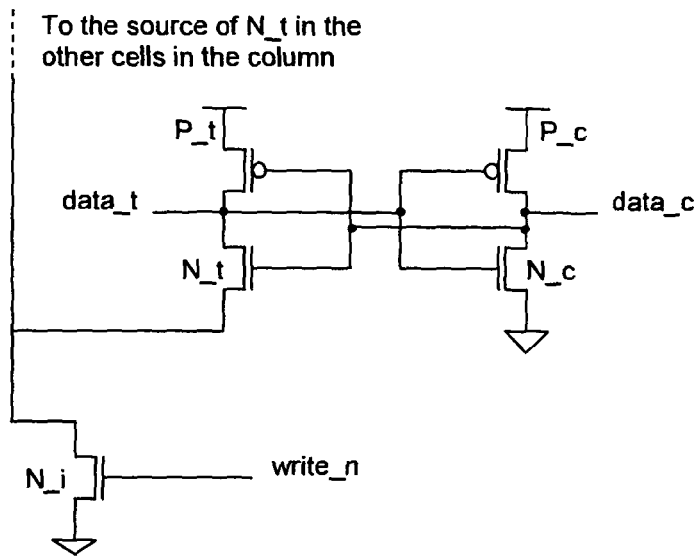
Figure 7. Cell source tristate circuit

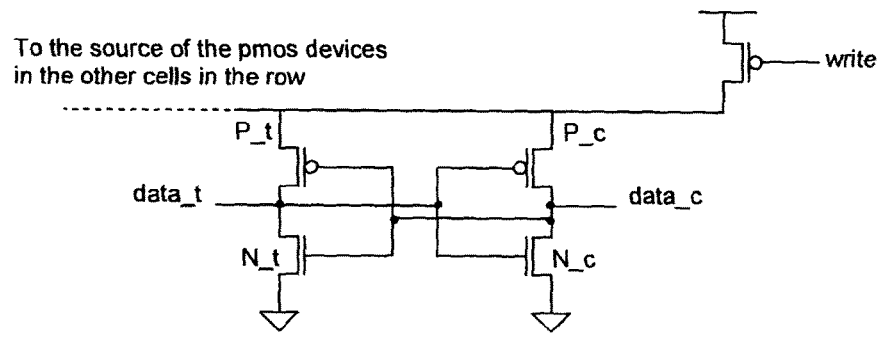
Figure 8. Cell vdd supply tristate circuit
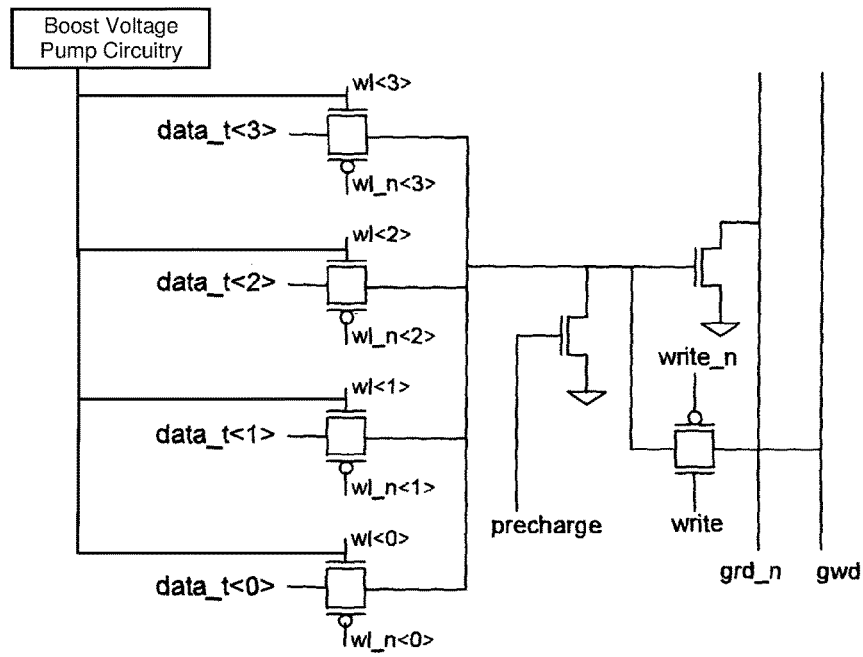
Figure 9. A read-write circuit with full transmission gate access devices

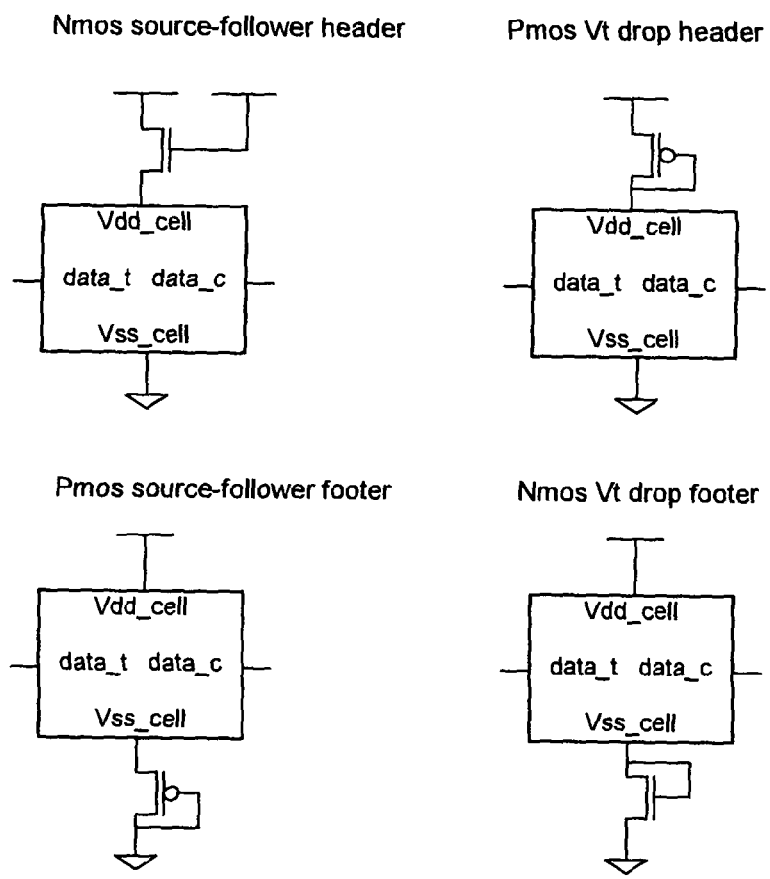
Figure 10.    Cell supply voltage reduction options

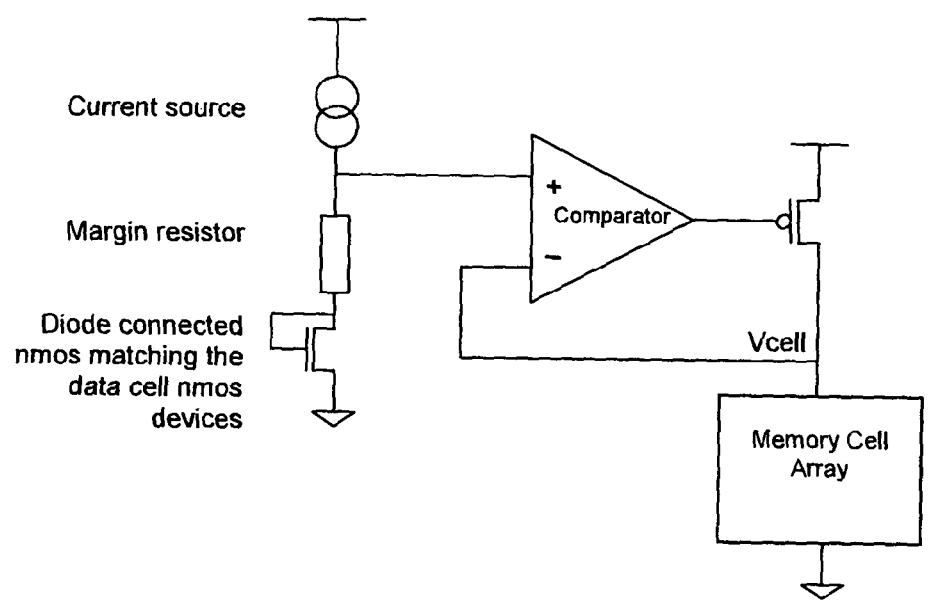
Figure 11.   Internal regulator with Vtn controlled supply level

STATIC RANDOM ACCESS MEMORY DEVICES INCLUDING A PLURALITY OF STORAGE CELLS AND A READ/WRITE CIRCUIT

FIELD OF THE INVENTION

The present invention relates to Static Random Access Memory (SRAM) devices.

BACKGROUND OF THE INVENTION

Most SRAMs today utilize a six transistor (6T) cell as shown in FIG. 1 of the accompanying drawings. Such designs can suffer from:
1. High static power consumption.
2. In modern manufacturing processes transistor performance variability is leading to memory operation limitations such as memory cell stability and manufacturing yield issues
3. Existing proposed solutions result in the use of greater silicon area.

In FIG. 1, a wordline wl selects a row of such cells in an array. Bitlines bl_t/c of the cells are connected orthogonally in columns. Usually the bitlines are precharged to the supply voltage Vdd ready for a read or write operation.

In a read operation, the cell selected by having its wordline raised to Vdd will pull either the true (bl_t) or complement (bl_c) bitline low creating a differential voltage on the bitline pair. This differential voltage can be sensed by an amplifier (the senseamp) connected to the column which recovers the read data to full rail (vdd and gnd). Often column multiplexing is employed to selected one of a set of columns to connect to the senseamp.

To write to a cell, the wordline is selected and full rail write data is driven onto the bitlines by the write drivers: to write 1 bl_t is driven to Vdd and bl_c to gnd and visa versa to write 0.

The standard 6T cell design has been used for many years, but there are some issues affecting the performance of this cell in modern semiconductor processes.

One such problem is that the wordline access devices A_t/c leak. This is a problem in itself because it increases the current consumption in standby mode, where the SRAM is powered up but is not being accessed. It is also potentially a problem in the operation of the SRAM. In a pathological case all cells on a bitline may store 0 except the one you want to read which stores 1. Reading that cell discharges bl_c, but all the other cells are seeing full Vdd across the access device A_t because the bitline is precharged and data_t=gnd. Thus, there is a leakage path through all the A_t devices in the other cells which can add up to reduce or even over-take the differential building on the other, actively read, bitline. This slows, or even corrupts the data being read. To circumvent this problem the number of cells per bitline column is reduced and the resulting sub-bitlines are connected hierarchically. The extra peripheral circuitry involved increases area, power consumption and complexity.

The leakage through the access devices is exacerbated by reverse narrow width effect [3]. This physical effect on small nmos devices causes their Vtn to be lower than normally sized devices. Lower Vtn means higher leakage.

Another problem is in the cell design itself. The cell stability, the ability of the cell to store and retain data safely, is affected by the relative sizes of the drive transistors (D_t/c) and access transistors (A_t/c). The beta ratio, the ratio of the strengths of these transistors (the drive beta divided by the access beta), must reach a certain level for the cell to be stable. Traditionally, the beta ratio should be a minimum of 1.5 in the 6T cell above.

The pmos transistors P_t/c also have an effect. Stronger pmos devices give a more stable cell, but if they are too strong the cell is more difficult to write to: the bitline write driver has to drive a long highly capacitive bitline, then through the weak access devices A_t/c and finally over-drive the pmos device. If the pmos are too strong, writes may fail.

Cell stability is often quantified by a metric known as static noise margin (SNM). The SNM of a particular cell design can be simulated: the higher the SNM, the more stable and more immune to noise the cell is.

The worst case operating point for stability of the traditional 6T cell is when wordline=Vdd and both bitlines=Vdd. This occurs during read or write when a column on a selected row is not being read or written but the bitlines are held precharged at Vdd. These conditions are collectively known has half-select. The SNM during half-select is usually much lower than during unselected states (i.e. when the wordline is gnd). Worst case SNM also occurs at the very start of a read operation, before the read has a chance to build differential on the bitline.

SNM also reduces with Vdd: the lower the Vdd, the lower the SNM. Manufacturing process variations across a given SRAM array cause a distribution of SNM: inevitably some cells in the array have lower SNM. On some cells, the SNM is so bad that the cell fails to operate. These so called soft fails are therefore proportional to Vdd (as opposed to hard fails which fail at all Vdd values and are related to physical defects with the cell). The stability of the cell during half-select limits the minimum voltage at which the SRAM can operate, because below that voltage soft-fails cause unacceptable yield loss.

Soft-fails are increasing as process geometries shrink causing higher variability in transistor performance within a chip. Pilo et al. [2] estimate that soft fails overtake hard fails between the 90 nm and 65 nm process generations. This is due to the transistor dimensions (oxide thicknesses, channel lengths etc.) approaching atomic levels. Any variations intrinsic to the manufacturing process will have a proportionally bigger effect on the smallest transistors on the chip. SRAMs are being particularly badly hit by the on chip variations because they contain these very small transistors, notably the access and P-load devices.

SUMMARY OF THE INVENTION

According to one aspect of the present invention, there is provided a new means of implementing a Static Random Access Memory (SRAM) that overcomes major problems with traditional SRAM designs. The access transistors are removed from the cell and are placed in a separate read-write circuit. The data storage node of the cell is connected to the source of an access transistor in the read-write circuit with a dedicated wire. The drains of all the access transistors are connected together at the rw_data signal which is used to drive an output means. Using this arrangement the data nodes of the cell exhibit a large parasitic routing capacitance and the rw_data node exhibits a small parasitic routing capacitance. Enabling the access transistor causes charge sharing between the data node and the rw_data node. Because the data node capacitance is much greater that the rw_data node capacitance the voltage present on the data node dominates thereby reading the data contents of the cell. The dominant read mechanism in the invention is charge sharing and read performance is therefore independent on the performance of the access transistor. As a result the design is immune to design and manufacturing variation of the access transistor. In addition, the size of the transistors in the cell can be set to optimize the cell stability and/or improve other aspects cell performance such as current leakage.

According to another aspect of the present invention, there is provided a static random access memory device which includes a plurality of storage cells and a read/write circuit, the read/write circuit being operable to modify respective states of the storage cells in the plurality of storage cells. The read/write circuit is thus shared by the storage cells.

In one example, the read/write circuit is connected to each of the storage cells in the plurality by respective dedicated connections. In one example, each storage cell includes a cross coupled inverter circuit operable to provide a latch circuit. In one example, the read/write circuit includes an access switch for each of the storage cells, the access switch being operable to control access by the read/write circuit to the corresponding storage cell. In such an example, each access switch is operable to control connection of a common read/write control output to the storage cell concerned. Such access switches may be controlled by wordline control signals. The access switches may be provided by single transistor devices, or by a combination of transistor devices. The storage cell may include a tristate transistor device.

In one application, the plurality of storage cells is arranged in a column format with the read/write circuit.

According another aspect of the present invention, there is a provided a method of controlling a static random access memory device, the method including changing states of respective storage cells in a plurality of storage using a common read/write circuit. Such a method includes switching an access transistor for each storage cell, as required.

In some example methods, the storage cell supply voltage is lowered, or the wordline voltage is raised.

Various aspects of the present inventions are illustrated in FIGS. 2 to 11 of the attached drawings.

BRIEF DESCRIPTION OF THE DRAWINGS

FIG. 1 shows a previously considered six transistor (6T) SRAM cell;
FIG. 2 shows a proposed data cell embodying one aspect of the present invention;
FIG. 3 shows a cell column and read-write circuit;
FIG. 4 shows the read-write circuit with nmos output transistor;
FIG. 5 shows a read-write circuit with output voltage recovery;
FIG. 6 shows a read-write circuit with full swing by precharge;
FIG. 7 shows a cell source tristate circuit;
FIG. 8 shows a cell vdd supply tristate circuit;
FIG. 9 shows a read-write circuit with full transmission gate access devices;
FIG. 10 shows a cell supply voltage reduction options; and
FIG. 11 Shows an internal regulator with Vtn controlled supply level.

DETAILED DESCRIPTION OF THE PREFERRED EMBODIMENTS

Various solutions to the drawbacks of previously considered SRAMs have been proposed, but most involve an increase in the area of the SRAM cell or its peripheral circuits, or both.

The proposed invention is outlined below. The proposed cell consists of a cross coupled inverter to form a latch as shown in FIG. 2.

The cells are stacked in a column and a read-write circuit is placed at the bottom of the column as shown in FIG. 3. One of the two data nodes of the cell, data_t or data_c (in our example data_t) of each of the cells is routed to the read-write circuit. The read-write circuit, FIG. 4, consists of an access pass transistor that connects between each of the data_t nodes and a shared node rw_data. All the data_t nodes run the full length of the column and therefore have a large routing capacitance. The rw_data node is local to the read-_write circuit and has a much lower routing capacitance.

FIG. 3 and subsequent figures show the case of a column of 4 data cells per read-write circuit for simplicity of representation. It should be noted that in reality the number of cells per read-write circuit is maximized according to the routing resources available between the cells and the read-write circuit i.e. the number of metal routes that can be fitted into the width of the cell and the number of metal layers available in the design.

Arrangement of the cells in a single column above the read-write circuit is not the only layout arrangement possible. If the data cell layout is narrow, multiple columns of cells can be placed above the read-write circuit. A further arrangement is to place a single or multiple columns of cells above and below the read-write circuit. In fact, any arrangement of cells can be used around the read-write circuit as long as it results in the data lines exhibiting a larger capacitance than the rw_data node within the read-write circuit.

To read the memory, one of the access transistors is enabled by raising one of the wordlines, wl<s>, connected to its gate. This causes charge sharing between the selected data_t line data_t<s> and rw_data. Because data_t<s> is a large capacitance node and rw_data is a low capacitance node the voltage on data_t<s> dominates. Minimal voltage disturbance is seen on data_t[s] whereas rw_data moves rapidly to the match voltage on data_t<s>. In addition, throughout this process the cell is still driving data_t<s> so voltage on data_t<s> quickly recovers. In this way the data value stored on data_t<s> is safely transferred to the rw_data node.

In FIG. 4 the access transistor is an nmos transistor. An nmos transistor cannot pass the full supply voltage from drain to source because it will turn off as Vgs reaches the turn on threshold of the nmos device, Vtn. This means that a cell with a supply Vdd can only drive Vdd-Vtn onto the rw_data node. In most processes this is a high enough voltage to be used to drive the output data, with for example an nmos transistor in a precharged high (Vdd) output line as shown in FIG. 4.

In some processes, or in designs required to operate at lower supply voltages, a voltage recovery circuit as shown in FIG. 5 may be employed to increase the output data voltage to full supply rail voltage, Vdd.

An alternative solution is to precharge rw_data to Vdd as shown in FIG. 6. A zero (ground voltage, 0V) stored in the cell will pull rw_data down to ground. A one (vdd) stored in the cell will not cause rw_data to discharge and it will stay at Vdd. This scheme works with a pmos output transistor connected to a precharged low (gnd) output line.

To write to a cell, global write data, gwd, is connected to the read-write circuit. In a write operation, the write control signal write_en rises and the enables the gwd signal to drive the rw_data node. One of the wordlines to select the desired cell rises enabling the rw_data node to drive via the access transistor the data_t node of the cell to be written. Because the access transistors are nmos, full vdd cannot be driven onto data_t, the driven voltage being limited to Vdd-Vtn (access transistor). In order to write to the cell a voltage that exceeds the switching threshold of the inverter inside the cell must be driven onto data_t. The cell nmos transistor N_t will also fight the applied voltage making a write '1' operation more difficult. In some manufacturing processes and at some operating conditions (temperature, vdd supply voltage and process corner) it may be impossible to write a '1' with this limited voltage and therefore write assist techniques must be used. A range of techniques are proposed as outlined below.

1) Lower the Cell Supply

By lowering the supply voltage to the cell the cell inverter threshold voltage will be lowered and the gate drive voltage of the cell transistor N_t will be reduced making it easier for the read-write circuit to drive a high enough voltage onto data_t to perform the write.

2) Tristate the Source of Cell Transistor N_t

By isolating the source of N_t from gnd, as shown in FIG. 7, we make it easier for the read-write circuit to drive a high voltage onto data_t. We must ensure that the elevated voltage on the n_source node common to all the cells in the column does not corrupt data stored in the other cells. The isolation nmos, N_i, can be gated by either a write control signal so that it is only turned off to isolate the source during a write operation, or by active low write data, whereby the N_i is turned off if the data to be written is a '1'.

3) Boost Wordline Voltage

Boost or voltage pump circuitry can be used to increase the voltage driven onto the wordlines above standard Vdd. This increases the voltage that can be driven onto data_t from Vdd-Vtn to Vboost-Vtn facilitating a write operation.

4) Tristate the Cell's pmos Source Transistors

When the read-write circuit drives data_t it may not be able to drive a high enough voltage to reach the switching threshold of the cell inverter and cause a write. It may, however, be strong enough to drive a voltage that is greater than the cell inverter's nmos, transistor N_c, Vt. This would turn on N_c and N_c would start to pull down the cell's internal data node data_c. However, it may not be strong enough to overpower the opposing pmos, P_c and cause a write. If we tristate the source of the pmos transistor P_c, or the sources of both P_c and P_t, as shown in FIG. 8, then N_c would start to pull down data_c which in turn would pull down the tri-stated source node p_source. Lowering p_source causes the threshold of the N_c/P_c inverter to lower. After some period p_source would lower to a level where the threshold of the inverter is lower than the voltage driven by the read write circuit onto the data_t node and the cell would be written.

5) Convert the Access Transistors into a Full Transmission Gate

By adding a pmos transistor in parallel to the nmos access transistor as shown in FIG. 9, the read-write circuit is able to drive a full Vdd voltage onto the data_t nodes. This method has the disadvantage of adding a large number of extra devices and also necessitates the creation of an active low wordline signal.

One or a combination of these methods can be used to ensure that the data cell is writeable.

Method (1), lowering the supply is especially advantageous as it will lower the active and standby power consumption of the cell. Standby power, which is caused by leakage currents in the transistors is a particularly important because as manufacturing processes shrink over time transistor leakage increases. In addition, there is a need for low leakage SRAMs across the industry for low power, battery powered and energy scavenging powered applications.

The supply voltage lowering described in (1) can be achieved in a number of ways:

i. A separate external supply can be provided to the memory
ii. Header Vt drop pmos or source follower drop nmos transistors can be applied to the cell supply as shown in FIG. 10.
iii. A regulator, internal to the SRAM can generate the supply from Vdd It should also be noted that an alternative method to lowering the Vdd is to raise the vss supply level to the cell. This can be done using (i) or (iii) above or with the use of footer Vt drop of pmos source follower drop transistors as shown in FIG. 10.

In the case of an internal regulator (iii), the regulated voltage can be designed to be proportional to the Vts of the transistors in the cell as shown in FIG. 11. This is advantageous as it minimises the applied cell supply voltage whilst guaranteeing safe operation of the memory across a wide range of process variations and temperatures. The disadvantage is that the regulator itself will consume standby current, potentially negating the leakage current saved.

In (1) the cell voltage is permanently held at a lower level. In some prior art header or footer voltage drop devices are added to the cell array to lower the Vdd supply or raise the gnd level to reduce leakage in special low leakage standby modes. However, it takes time for these modes to be entered and exited and extra logic must be added in the system to control when the low power mode is used.

In the proposed invention the cell array is constantly held at the lower voltage, so no such disadvantages exist. Memory peripheral circuitry (address decode, global read/write circuitry etc.) does still need to be power gated for minimum standby power.

The proposed invention is particularly suited for use in low leakage SRAMs because:
 the cell voltage is permanently lowered below Vdd
 the cell transistors can have longer gate lengths lowering sub-threshold leakage.

The proposed invention has many advantages over the existing prior art 6T cell. The dominant read mechanism is charge equalisation; therefore the strength of the transistors in the cell and the beta ratio, the ratio between the strength of the cell drive transistor and the strength of the access transistors, is no longer important. This means that the cell transistors can much weaker and still operate reliably. Weaker cell transistors confer a number of advantages:

1) The cell transistors and therefore the cell area can smaller OR
2) The cell transistors can have longer gate lengths making them weaker and reducing their leakage current in standby
3) Manufacturing variations when the cells are made are much less likely to cause the cell to fail In the proposed invention there are no small, weak access transistors in the cell and there is also no long bit-lines that make writing to the cell difficult. The P:N ratio of the cell transistors can therefore be set for cell stability alone. Removing the two small manufacturing variation sensitive access transistors from the cell improves the yield and reliability of the design. The proposed invention also uses just one cell access device per cell in most arrangements, reducing the number of current leakage paths that contribute to the standby power of the memory.

The proposed invention also removes the need for large, variation intolerant senseamps on local bitlines. This saves area, power consumption and simplifies the design.

REFERENCES

[1] B. Calhoun and A. Chandrakasan "A 256 kb 65 nm Sub-threshold SRAM Design for Ultra-Low-Voltage Operation" IEEE Journal of Solid-state Circuits, March 2007, volume 42, number 3 pp. 680-688
[2] H. Pilo, C Barwin et al "An SRAM Design in 65-nm Technology Node Featuring Read and Write-Assist Circuits to Expand Operating Voltage" IEEE Journal of Solid-state Circuits, April 2007, volume 42, number 4 pp. 813-819
[3] Shigeki Ohbayashi et al "A 65-nm SoC Embedded 6T-SRAM Designed for Manufacturability with Read and Write Operation Stabilizing Circuits" IEEE Journal of Solid-state Circuits, April 2007, volume 42, number 4 pp. 820-829

What is claimed is:

1. A static random access memory device including:
a plurality of storage cells arranged in a stack; and
a read-write circuit that is separate from the plurality of storage cells, the read-write circuit configured to modify a state of a storage cell of the plurality of storage cells, wherein the read-write circuit comprises a plurality of access transistors, the number of access transistors of the plurality of access transistors being equal to the number of storage cells and each one of the plurality of access transistors having a dedicated connection between a data node of a respective different one of the plurality of storage cells and a common read-write data node of the read-write circuit.

2. A static random access memory according to claim 1 wherein each storage cell of the plurality of storage cells includes a cross coupled inverter circuit that provides a latch circuit.

3. A static random access memory according to claim 1 wherein each access transistor of the plurality of access transistors is controlled by a corresponding wordline control signal.

4. A static random access memory according to claim 1 wherein each of the dedicated connections that connect each storage cell of the plurality of storage cells to the read-write circuit exhibits a capacitance.

5. A static random access memory access device according to claim 4 wherein each of the dedicated connections that connect each storage cell of the plurality of storage cells to the read-write circuit exhibits a larger capacitance than the common read-write data node of the read-write circuit.

6. A static random access memory device according to claim 4 wherein the read-write circuit includes a write data connection and means for connecting the write data connection to the common read-write data node of the read-write circuit to permit data to be written to a storage cell of the plurality of storage cells.

7. A static random access memory device according to claim 6 further comprising means for lowering a supply voltage to a first storage cell of the plurality of storage cells.

8. A static random access memory device according to claim 7 wherein the plurality of storage cells are supplied by a separate power supply.

9. A static random access memory device according to claim 7 wherein the means for lowering the supply voltage to the first storage cell of the plurality of storage cells comprises a switch that reduces the voltage supplied to the storage cell.

10. A static random access memory device according to claim 9 wherein the switch comprises an NMOS source-follower header, a PMOS source-follower footer, a PMOS threshold voltage drop header or an NMOS threshold voltage drop footer.

11. A static random access memory device according to claim 7 further comprising a regulator internal to the static random access memory device, the regulator being configured to generate a supply voltage to the storage cell of the plurality of storage cells from a supply voltage to the static random access memory device.

12. A static random access memory device according to claim 6 wherein each storage cell of the plurality of storage cells includes a cross coupled inverter circuit which provides a latch circuit and wherein the cross coupled inverter circuit of each storage cell comprises an NMOS having a source terminal, the static random access memory device further comprising a switch that isolates the source terminal of the NMOS of the cross coupled inverter circuit from ground.

13. A static random access memory device according to claim 1 further comprising a voltage recovery circuit associated with the common read-write data node for increasing a voltage at the common read-write data node during a read operation of the static random access memory device.

14. A static random access memory device according to claim 1 further comprising means for pre-charging the read-write data node to a supply voltage of the static random access memory device, to increase a voltage at the common read-write data node during a read operation of the static random access memory device.

15. A static random access memory device according to claim 1 wherein each of the plurality of access transistors comprises a full transmission gate with both NMOS and PMOS devices.

16. A static random access memory device according to claim 1 wherein the plurality of storage cells is arranged in a column format with the read write circuit.

17. A static random access memory device including:
a plurality of storage cells; and
a read-write circuit that is separate from the plurality of storage cells, the read-write circuit configured to modify a state of a storage cell of the plurality of storage cells, wherein the read-write circuit comprises a plurality of access transistors, the number of access transistors of the plurality of access transistors being equal to the number of storage cells and each one of the plurality of access transistors having a dedicated connection between a data node of a respective different one of the plurality of storage cells and a common read-write data node of the read-write circuit, wherein each access transistor of the plurality of access transistors is controlled by a corresponding different wordline control signal, the static random access memory device further comprising boost or voltage pump circuitry configured operable to increase a voltage on each of the wordlines to a level above that of a supply voltage of the static random access memory device.

18. A static random access memory device including:
a plurality of storage cells arranged in a stack; and
a read-write circuit that is separate from the plurality of storage cells, the read-write circuit configured to modify a state of a storage cell of the plurality of storage cells, the read-write circuit comprising:
a common read-write data node; and a plurality of access transistors, the number of access transistors of the plurality of access transistors being equal to the number of storage cells and each one of the plurality of access transistors having a dedicated connection between a data node of a respective different one of the plurality of storage cells and the common read-write data node of the read-write circuit, each of the dedicated connections exhibiting a larger capacitance than the common read-write data node.

* * * * *